United States Patent [19]
Lysinger

[11] Patent Number: 5,608,678
[45] Date of Patent: Mar. 4, 1997

[54] COLUMN REDUNDANCY OF A MULTIPLE BLOCK MEMORY ARCHITECTURE

[75] Inventor: Mark A. Lysinger, Carrollton, Tex.

[73] Assignee: SGS-Thomson Microelectronics, Inc., Carrollton, Tex.

[21] Appl. No.: 509,351

[22] Filed: Jul. 31, 1995

[51] Int. Cl.$^6$ ............................................. G11C 7/00
[52] U.S. Cl. .............. 365/200; 365/189.02; 365/225.7; 365/230.02; 365/230.03
[58] Field of Search ............................ 365/200, 189.02, 365/230.02, 230.03, 225.7

[56] References Cited

U.S. PATENT DOCUMENTS

| | | | |
|---|---|---|---|
| 4,228,528 | 10/1980 | Cenker et al. | 365/200 |
| 5,355,340 | 10/1994 | Coker et al. | 365/200 |
| 5,404,331 | 4/1995 | McClure | 365/200 |
| 5,438,546 | 8/1995 | Ishac et al. | 365/200 |
| 5,469,391 | 11/1995 | Haraguchi | 365/200 |

FOREIGN PATENT DOCUMENTS

| | | | |
|---|---|---|---|
| 0361404 | 4/1990 | European Pat. Off. | G06F 11/20 |
| 3906897A1 | 9/1989 | Germany | G11C 29/00 |
| 2165971A | 4/1986 | United Kingdom | G06F 11/20 |

*Primary Examiner*—Son T. Dinh
*Attorney, Agent, or Firm*—Theodore E. Galanthay; Lisa K. Jorgenson; Renee M. Larson

[57] ABSTRACT

According to the present invention, column redundancy circuitry provides column redundancy to an integrated circuit memory device having a multiple block memory architecture with limited programming overhead and maximum flexibility. Column redundancy circuitry is placed within a block of the multiple block memory architecture and may be placed within multiple blocks of the integrated circuit device as required. The column redundancy circuitry has a column select multiplexing circuit, an input/output select circuit for a redundant column of the memory array, and a redundant column select circuit to drive the input/output select circuit for a redundant column. Fuse circuitry contained within column select multiplexing circuit disables a bad prime column by removing fuses in order to isolate the bitline pair associated with the bad column from the read and write busses of the memory array. A fuse of an input/output select circuit contained within an input/output group of a block containing the redundant column to be enabled is left intact in order to connect the bitline pair of the enabled redundant column to the read and write busses of the memory array. The fuses of other input/output select circuits contained within the remaining input/output groups of the block are removed in order to isolate the redundant column from the write and read busses of the other input/output groups. The state of a redundant column signal of the input/output select circuit and whether the fuse is intact or removed will determine whether a redundant column is accessed. Control of the redundant column signal is provided by the redundant column select circuit; thus the redundant column select circuit drives the input/output select circuit for a redundant column.

18 Claims, 2 Drawing Sheets

COLUMN REDUNDANCY OF A MULTIPLE BLOCK MEMORY ARCHITECTURE

BACKGROUND OF THE INVENTION

The present invention relates generally to integrated circuit memory devices, and more specifically to column redundancy circuitry of integrated circuit memory devices.

Random defects of a manufacturing process used to produce integrated circuit memory devices can render non-redundant elements of an integrated circuit memory device, such as columns and rows, defective. The random defects associated with a manufacturing process may be caused by a number of factors, including particle defects such as broken or shorted out columns and rows, particle contamination, bit defects, locked rows and locked columns.

Redundant elements of a integrated circuit memory devices, such as redundant rows and redundant columns, are used to compensate for these random process defects. During initial testing of an integrated circuit memory device, defective elements are replaced by non-defective elements referred to as redundant elements. Thus, redundant columns and redundant rows are used to replace defective prime columns and rows, respectively, discovered during initial testing of the integrated circuit memory device. The use of redundant elements are extremely important, then, in increasing the overall yield of an integrated circuit memory device.

With ever increasing densities and smaller feature sizes in integrated circuit memory devices, cell redundancy has become more and more important to the proper functioning of larger memory devices. Most memories now require both row and column redundancy. Typical column redundancy schemes provide flexibility but often have the disadvantage of a large programming overhead. Programming overhead refers to the circuitry required to substitute a functional redundant element for a defective non-redundant or prime element, such as replacing a defective prime column with a redundant column. Circuitry which typically contributes to programming overhead of a column redundancy scheme includes block select programming circuitry and word line driver circuitry. Block select programming circuitry determines which block of a multiple block integrated circuit memory device will be selected to have a defective non-redundant element replaced with a functional redundant element. Word line driver circuitry is typically required for both redundant columns as well as regular or prime columns and this, of course, further swells the size of local wordline driver overhead associated with column redundancy for an integrated circuit memory device. Thus, it would be desirable to provide flexible column redundancy without a large programming overhead.

SUMMARY OF THE INVENTION

It is an object of the present invention to provide flexible column redundancy without a large programming overhead.

Therefore, according to the present invention, column redundancy circuitry provides column redundancy to an integrated circuit memory device having a multiple block memory architecture with limited programming overhead and maximum flexibility. Column redundancy circuitry is placed within a block of the multiple block memory architecture and may be placed within multiple blocks of the integrated circuit device as required. Because the column redundancy circuitry is placed within a block, block select programming is not required.

The column redundancy circuitry has a column select multiplexing circuit for prime columns of the memory array, an input/output select circuit for a redundant column of the memory array, and a redundant column select circuit to drive the input/output select circuit for a redundant column. The column select multiplexing circuit of the memory array exists for each input/output group within a block of the memory array. Certain elements of the column select multiplexing circuit are further replicated a number of times within an input/output group as a function of the number of columns contained within the input/output group. Fuse circuitry contained within the column select multiplexing circuit disables a bad prime column by removing fuses in order to isolate the bitline pair associated with the bad column from the read and write busses of the memory array.

The input/output select circuit for a redundant column exists for each input/output group within a block of the memory array. The input/output select circuit controls whether the redundant column will be enabled to replace a bad prime column. A fuse of an input/output select circuit contained within an input/output group of a block containing the redundant column to be enabled is left intact in order to connect the bitline pair of the enabled redundant column to the read and write busses of the memory array. The fuses of other input/output select circuits contained within the remaining input/output groups of the block are removed in order to isolate the redundant column from the write and read busses of the other input/output groups. The state of a redundant column signal of the input/output select circuit and whether the fuse is intact or removed will determine whether a redundant column is accessed. Control of the redundant column signal is provided by the redundant column select circuit; thus the redundant column select circuit drives the input/output select circuit for a redundant column.

The modular column redundancy scheme of the present invention may be used on a variety of processes and devices and provides flexible column redundancy without a large programming overhead. It is important to note that the present invention could also be used in a simple one block array in addition to a multiple block array.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

Figure 1:
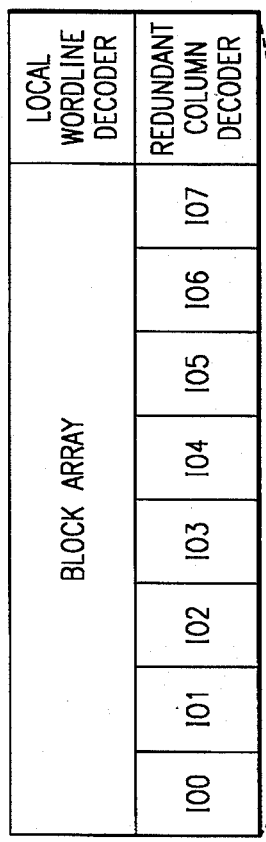
FIG. 1 is a multiple block memory architecture of an integrated circuit memory device.

The column redundancy scheme of the present invention may be used in a simple one block array or it may be employed on multiple block integrated circuit memory device architectures which group columns together by input/output circuitry. Referring to FIG. 1, a multiple block memory architecture of an integrated circuit memory device is shown. Any number of blocks may be used, but for purposes of illustration, an integrated circuit memory device having sixteen blocks will be described. The device of FIG. 1 shows sixteen blocks: BLK0, BLK1, BLK2, BLK3, BLK4, BLK5, BLK6, BLK7, BLK8, BLK9, BLK10, BLK11, BLK12, BLK13, BLK14 and BLK15. Blocks BLK0, BLK1, BLK2, BLK3, BLK4, BLK5, BLK6 and BLK7 are separated from the eight remaining blocks BLK8, BLK9, BLK10, BLK11, BLK12, BLK13, BLK14 and BLK15 by the Row Decoder block. Each block is associated with Local Row Decoder blocks which, as illustrated in FIG. 1, reside between every two blocks. The blocks proceed from the left, or Vss, end to the right, or Vcc, end of the integrated circuit memory device.

Each block is divided into eight input/output groups each having sixteen columns. As indicated in FIG. 1, input/output groups IO0, IO1, IO2, IO3, IO4, IO5, IO6 and IO7, designated "Block Array", are associated with block BLK0. Redundant Column Decoder block and Local Wordline Decoder block are associated with input/output groups IO0-IO7. Each of the sixteen blocks BLK0, BLK1, BLK2, BLK3, BLK4, BLK5, BLK6, BLK7, BLK8, BLK9, BLK10, BLK11, BLK12, BLK13, BLK14 and BLK15, then, has eight input/output groups IO0, IO1, IO2, IO3, IO4, IO5, IO6 and IO7 associated with it. Thus, an integrated circuit device having sixteen blocks will have a total of 128 input/output groups and 2,048 columns.

The column redundancy circuitry of the present invention is designed to fit within a block in a multiple block memory architecture and thus does not require block select programming. Because block select programming is not required, programming overhead associated with the column redundancy scheme is reduced. Additionally, placing the column redundancy scheme within a block of a multiple block memory architecture means that no special word line drivers are required for redundant columns. Rather, as shown in FIG. 1, Local Row Decoder circuitry for local wordlines is accessible by each block. The same word line driver used for prime, or non-redundant, columns is also used for redundant columns.

Any number of redundant columns may be added to the prime array of the integrated circuit device. The correct number of redundant columns added to the prime memory array is based on considerations of layout and defect statistics representative of the manufacturing process used to make the integrated circuit memory device. Thus, different device types may require a different number of redundant columns. For instance, a first device type having a relatively high percentage of defects will require more redundant columns than a second device type having a lower percentage of defects. Redundant columns added to the prime memory array may be placed in close proximity to the word line driver in order to enhance device performance.

Figure 2:
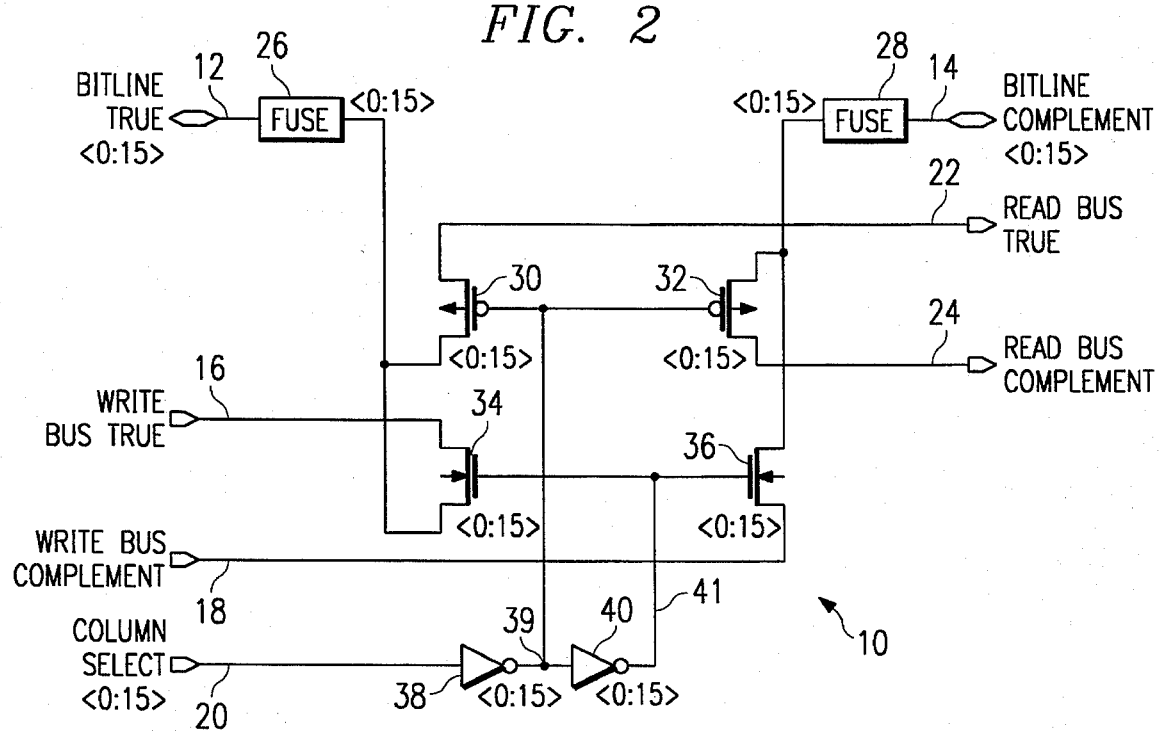
FIG. 2 is a column select multiplexing circuit, according to the present invention.

Referring to FIG. 2, a column select multiplexing circuit 10 is shown. Column select multiplexing circuit 10 provides column select multiplexing for non-redundant or prime columns of the memory device. Column select multiplexing circuit 10 exists for each input/output group within a block of a multiple block integrated circuit memory device; thus, there are eight placements of column select multiplexing circuit 10 in each block. And, because there are sixteen columns within each input/output group, there are sixteen placements of several elements of column select multiplexing circuit 10 within an input/output group. Those elements which are replicated sixteen times within an input/output group include bitline true 12 and its associated fuse 26, bitline complement 14 and its associated fuse 28, and transistors 30, 32, 34, and 36. There are also sixteen column select signals 20 within an input/output group. Write bus true 16, write bus complement 18, read bus true 22, and read bus complement 24 of column select multiplexing circuit 10 are not replicated within an input/output group.

A single placement of column select multiplexing circuit 10 will now be discussed. Bitline true 12 is connected to fuse 26 and whether fuse 26 is blown or intact determines whether bitline true 12 will be connected to a source/drain of p-channel transistor 30 and n-channel transistor 34. Similarly, bitline complement 14 is connected to fuse 28 and whether fuse 28 is blown or intact determines whether bitline complement 14 will be connected to a source/drain of p-channel transistor 32 and n-channel transistor 36. Column select signal 20 is inverted by inverter 38 to become signal 39. Signal 39 controls the gates of p-channel transistors 30 and 32. Signal 39 is inverted by inverter 40 to become signal 41, which is equal in state to column select signal 20. Signal 41 controls the gates of n-channel transistors 34 and 36. Write bus true 16 is connected to a source/drain of n-channel transistor 34 and write bus complement 18 is connected to a source/drain of n-channel transistor 36. Read bus true is connected to p-channel transistor 30 and read bus complement is connected to p-channel transistor 32. As previously indicated, each of the sixteen placements of column select multiplexing circuit 10 of a block share write busses 16, 18 and read busses 22, 24.

To enable a redundant column, fuses must be removed by cutting or blowing them. Sixteen columns are grouped together per input/output group and sixteen column select signals 20 which determine which of the sixteen pairs of bitlines, bitline true 12 and bitline complement 14, will be transferred to the read buses, read bus true 22 and read bus complement 24, and to the write busses, write bus true 16 and write bus complement 18. Fuse 26, associated with bitline true 12, and fuse 28, associated with bitline complement 14, if blown, can separate their associated bitline from the column select multiplexing function of column select multiplexing circuit 10. When it has been determined that a given column is bad and thus needs to be replaced, fuses 26 and 28 for a bitline pair associated with the bad column are removed thereby isolating the bitline pair, bitline true 12 and bitline complement 14, and thus the memory array from column select multiplexing circuit 10. This isolation is necessary to prevent inappropriate data from reaching the read busses 22, 24 or the write busses 16, 18. Note that even though a bad column is to be replaced, the isolation of bitline pair 12, 14 does not prevent column select multiplexing circuit 10 from operating such that appropriate transfer gates are enabled.

Figure 3:
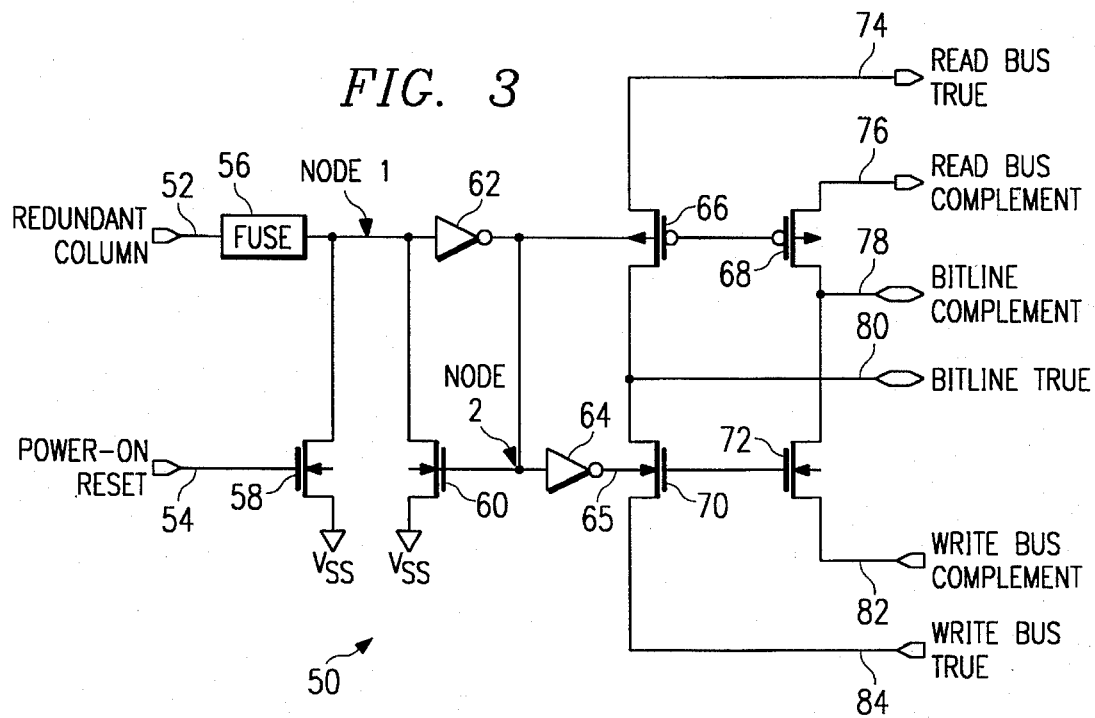
FIG. 3 is an input/output select circuit for a redundant column, according to the present invention.

Referring to FIG. 3, input/output select circuit 50 for a redundant column is shown. Column select multiplexing circuit 10 provides input/output select for a redundant column of the integrated circuit memory device. The fuse circuitry of input/output select circuit 50 controls whether the redundant bitlines will be connected to the read and write busses of the integrated circuit memory device. Input/output select circuit 50, like column select multiplexing circuit 10, exists for each input/output group within a block of a multiple block integrated circuit memory device. Thus, for a one redundant column example, there will be eight placements of input/output select circuit 50 within a block, one for each of the input/output groups of that block.

As shown in FIG. 3, a placement of input/output select circuit 50 has the following elements: redundant column signal 52, power-on reset signal 54, fuse 56, transistors 58, 60, 66, 68, 70, 72, inverters 62, 64, read bus true 74, read bus complement 76, bitline complement 78, bitline true 80, write bus complement 82, and write bus true 84. Read bus true 74, read bus complement 76, write bus true 84 and write bus complement 82 are analogous to read bus true 22, read bus complement 24, write bus true 16 and write bus complement 18, respectively, of FIG. 2. The input/output select circuit 50 of a redundant column of FIG. 3 is similar to FIG. 2 with the exception of the fuse and half-latch circuitry of input/output select circuit 50.

Redundant column signal 52 is selectively connected to Node 1 of input/output select circuit 50 depending upon whether fuse 56 is intact. Node 1 is defined as the electrical connection of the output signal of fuse 56, a source/drain of n-channel transistor 58, a source/drain of n-channel transistor 60, and an input signal of inverter 62. The half-latch is formed by inverter 62 and transistor 60. Power on reset signal 54 controls the gate of pull-down n-channel transistor 58. Node 2 is defined as the electrical connection of the gate of transistor 60, the output signal of inverter 62, the input signal of inverter 64, and the gates of p-channel transistors 66 and 68. The output signal 65 of inverter 64 drives the gates of n-channel transistors 70 and 72.

Redundant column signal 52 is common to all input/output select circuits 50 placed in an input/output group within a block for a given redundant column. An input/output group is programmed by leaving fuse 56 intact for the input/output select circuit 50 corresponding to the input/output group of interest. All other fuses 56 corresponding to the other input/output groups of the block, in the other seven placements of input/output select circuit 50, must be removed. If fuse 56 is removed from input/output select circuit 50, the combination of n-channel transistor 58 gated by power-on-reset signal 54 and the half latch will insure that the selected redundant column is isolated from the read and write buses.

When column redundancy is enabled, redundant column signal 52 will go to a high logic state (1) when a redundant column is accessed. If fuse 56 is intact, the redundant bitlines, bitline true 80 and bitline complement 78, will be connected to the read and write busses 74, 76, 82, 84. In the event that the redundant column is not used, then redundant column signal 52 must stay low (0) to isolate the read and write busses from the redundant bitlines. By design the fuses 56 of all inputs/output groups will be intact such that no fuses are removed on a prime die, i.e. a die having no defects.

Figure 4:
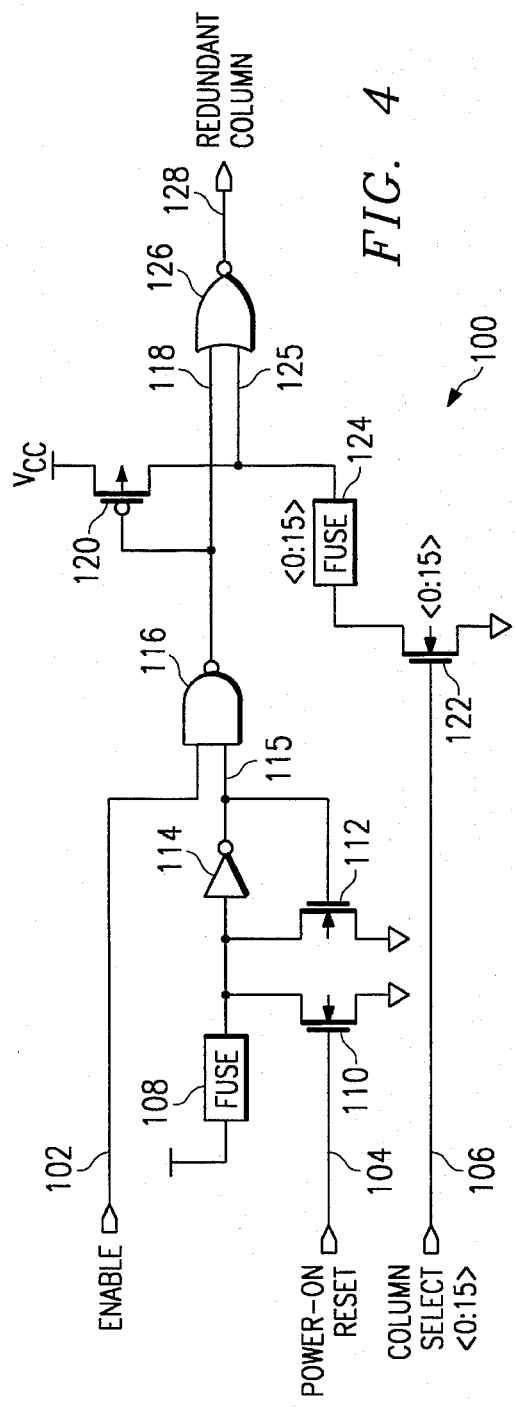
FIG. 4 is a redundant column select circuit, according to the present invention.

Control of redundant column signal 52 is provided by the redundant column select circuit 100 of FIG. 4. Redundant column select circuit 100 produces redundant column signal 128, which is equal to redundant column signal 52 of FIG. 3. Only one placement of redundant column select circuit 100 is required to drive eight placements of input/output select circuit 50 of FIG. 3 for a given block. Thus, redundant column signal 128 drives the eight placements of redundant column signal 52 of FIG. 3. Redundant column select circuit 100 has a number of elements including fuse 108, n-channel transistors 110, 112, 122, p-channel transistor 120, inverter 114, NAND logic gate 116, fuse 124, NOR logic gate 126, enable signal 102, power-on reset signal 104, and column select signal 106. Column select signal 106 is analogous to the state of column select signal 20 or signal 41 of FIG. 2. As indicated by the notation "<0:15>", there are sixteen placements of column select signal 106 connected to its associated transistor 122 and fuse 124, one for each of the sixteen columns within the input/output group.

In order to enable a redundant column, redundant column select circuit 100 requires that two input signals to NAND logic gate 116 be equal to the proper logic state. The first signal is Enable signal 102 and the second signal is signal 115; both Enable signal 102 and signal 115 are input signals to NAND logic gate 116 which produces redundant column enable signal 118. Signal 115 is produced by fuse 108 and its associated half-latch. Redundant column select circuit 100 of FIG. 4 employs fuse and half latch circuitry similar to that of FIG. 3; fuse 108 is connected to power supply Vcc, whereas in FIG. 2 fuse 56 is driven by redundant column signal 52. If fuse 108 is intact, then the half-latch output 115 is low, disabling the redundant column. If fuse 108 is removed, then the combination of transistor 110 gated by power on reset signal 104 and the half-latch will keep half-latch output 115 high, enabling the redundant column. Power-on reset signal 104 and power-on reset signal 54 of FIG. 3 produce a high-going pulse when power is supplied to the integrated circuit memory device and thus initiate the latches of FIGS. 3 and 4 to their proper state. Enable signal 102 is typically a chip select, a chip enable signal, or some derivative signal thereof of the integrated circuit memory device. When the device powers down, enable signal 102 disables transistor 120 in order to eliminate direct current (D.C.) during a powered-down state.

Redundant column enable signal 118, the output signal of NAND gate 116, goes low when all enable conditions described above are met. P-channel load transistor 120 is weak so that n-channel pull-down transistor 122 is capable of controlling the state of signal 125. The input signals 118 and 125 of NOR gate 126 determine the state of redundant column signal 128. Fuse 124 corresponding to the column select of interest is left intact and all other fuses in the circuit are removed. Thus, when the column of interest is accessed, signal 125 is pulled low through the intact fuse 124. Any other column select signal associated with another column will not be able to pull signal 125 low. When signal 125 and redundant column enable signal 118 are low, then redundant column signal 128 is high indicating a column address match.

The column redundancy scheme of the present invention provides column redundancy to an integrated circuit memory device having a multiple block memory architecture with limited programming overhead and maximum flexibility. The low programming overhead and flexibility accorded by the present invention is achieved by virtue of the modular approach of the multiple block memory architecture. Column redundancy circuitry is placed within a block of the multiple block memory architecture and may be placed within multiple blocks of the integrated circuit device as required. Because the column redundancy circuitry is designed to fit within a block, block select programming normally associated with prior art column redundancy circuits is not required. Likewise, the modular block approach of the present invention negates the need for a special word line driver for redundant columns; the same word line driver used for prime columns is used for redundant columns. Additionally, because the column redundancy circuitry is self-contained, it may be used on a variety of semiconductor processes and integrated circuit memory device types.

While the invention has been particularly shown and described with reference to a preferred embodiment, it will be understood by those skilled in the art that various changes in form and detail may be made therein without departing from the spirit and scope of the invention. The column redundancy scheme of the present invention may be employed on a simple one block array or on multiple block integrated circuit memory device architectures which group columns together by input/output circuitry. A number of column select signal lines are used to multiplex (mux) bitline data onto the read and write busses. If a common read/write bus is used, simple modifications will allow the present invention to still be used.

What is claimed is:

1. A column redundancy structure of an integrated circuit memory device, comprising:

a block of a memory array of the integrated circuit memory device, wherein the block is divided into a plurality of input/output groups with each input/output group of the plurality of input/output groups having a plurality of columns;

a plurality of column select multiplexing circuits, with a column select multiplexing circuit of the plurality of column select multiplexing circuits contained within each input/output group of the plurality of input/output groups and with the column select multiplexing circuit coupled to a write bus true, a write bus complement, a read bus true, and a read bus complement;

a plurality of redundant column input/output select circuits, with a redundant column input/output select circuit of the plurality of redundant column input/output select circuits contained within each input/output group of the plurality of input/output groups and with the redundant column input/output select circuit coupled to the write bus true, the write bus complement, the read bus true, and the read bus complement;

means contained within the column select multiplexing circuit for disabling a bad prime column of the column select multiplexing circuit; and means contained within the redundant column input/output select circuit for enabling a redundant column of the memory array.

2. The structure of claim 1, wherein the integrated circuit memory device has a multiple block memory architecture and the block is a block of a plurality of blocks.

3. The structure of claim 1, wherein the means contained within the column select multiplexing circuit for disabling a bad prime column of the column select multiplexing circuit is a fuse circuit and a redundant column signal produced by a redundant column select circuit.

4. The structure of claim 3, wherein a fuse element of the fuse circuit is removed in order to isolate a bitline pair connected to the bad column from the read bus true, the read bus complement, the write bus true, and the write complement bus of the memory array when the redundant column signal is equal to a first logic state.

5. The structure of claim 3, wherein the redundant column select circuit comprises:

a first fuse element having a first terminal and a second terminal, with the first terminal of the first fuse element coupled to a first voltage supply;

a second fuse element having a first terminal and a second terminal;

an inverter having a first terminal and a second terminal, with the first terminal of the inverter coupled to the second terminal of the first fuse element;

a first logic element having a first input terminal, a second input terminal and an output terminal;

a second logic element having a first input terminal, a second input terminal and an output terminal, with the output terminal of the first logic element coupled to the first input terminal of the second logic element;

a first transistor, a second transistor, a third transistor, and a fourth transistor, with each transistor have a gate, a first terminal and a second terminal, with a first terminal of the first transistor and a first terminal of the second transistor coupled to the second terminal of the first fuse element; with a gate of the second transistor coupled to a second terminal of the inverter and a second input terminal of the first logic element; with a second terminal of the first transistor, a second terminal of the second transistor, and a second terminal of the fourth transistor coupled to a second supply voltage; a gate of the third transistor coupled to the output terminal of the first logic element; with a first terminal of the third transistor coupled to the first supply voltage; with a second terminal of the third transistor coupled to the second terminal of the second fuse element and the second input terminal of the second logic element; with a first terminal of the fourth transistor coupled to the first terminal of the second fuse element;

a power-on reset signal coupled to a gate of the first transistor;

an enable signal coupled to a first input terminal of the first logic element;

a column select signal coupled to a gate of the fourth transistor; and a redundant column signal produced by the second logic element and coupled to the output terminal of the second logic element.

6. The structure of claim 1, wherein the means contained within the redundant column input/output select circuit for enabling a redundant column of the memory array is a fuse circuit.

7. The structure of claim 6, wherein a fuse element of the fuse circuit is left intact to connect a bitline pair connected to the redundant column to the read bus true, the read bus complement, the write bus true, and the write bus complement of the memory array.

8. The structure of claim 1, wherein the column select multiplexing circuit comprises:

a bitline true connected to a first fuse element;

a bitline complement connected to a second fuse element;

a column select signal;

a first transistor, a second transistor, a third transistor, and a fourth transistor, with each transistor having a gate, a first terminal, and a second terminal, with a first terminal of the first transistor coupled to the read bus true, with a second terminal of the first transistor coupled to the first fuse element and a terminal of the third transistor, with a first terminal of the third transistor coupled to the write bus true, with a first terminal of the second transistor coupled to the second fuse element and a first terminal of the fourth transistor, with a second terminal of the second transistor coupled to the read bus complement, and with a second terminal of the fourth transistor coupled to the write bus complement; and a first inverter and a second inverter, with an input terminal of the first inverter coupled to the column select signal, with an output signal of the first inverter coupled to the gate of the first transistor, the gate of the second transistor, and an input terminal of the second inverter, with an output signal of the second inverter coupled to the gate of the third transistor and the gate of the fourth transistor.

9. The structure of claim 1, wherein the redundant column input/output select circuit comprises:

a fuse element having an first terminal and a second terminal;

a first inverter and a second inverter, with each inverter having a first terminal and a second terminal;

a first transistor, a second transistor, a third transistor, a fourth transistor, a fifth transistor, and a sixth transistor, with each transistor having a gate, a first terminal and a second terminal; with a second terminal of the first transistor and a second terminal of the second transistor coupled to a voltage supply, with a first terminal of the first transistor coupled to a first terminal of the second transistor, a second terminal of the fuse element, and a first terminal of the first inverter, with a gate of the second transistor coupled to a second terminal of the first inverter, a first terminal of the second inverter, a gate of the third transistor, and a gate of the fourth transistor, with a second terminal of the second inverter coupled to a gate of the fifth transistor and a gate of the sixth transistor; with a first terminal of the third transistor coupled to the read bus true; with a first terminal of the fourth transistor coupled to the read bus complement; with a second terminal of the third transistor coupled to a first terminal of the fifth transistor and a redundant bitline true; with a first terminal of the fourth transistor coupled to the read bus complement; with a second terminal of the fourth transistor coupled to a first terminal of the sixth transistor and a redundant bitline complement; with a second terminal of the fifth transistor coupled to the write bus true and a second terminal of the sixth transistor coupled to the write bus complement;

a redundant column signal coupled to the first terminal of the fuse element; and a power-on reset signal coupled to the gate of the first transistor.

10. A column redundancy structure of an integrated circuit memory device, comprising:

a block of a memory array of the integrated circuit memory device, wherein the block is divided into a plurality of input/output groups with each input/output group of the plurality of input/output groups having a plurality of columns;

a plurality of column select multiplexing circuits, with a column select multiplexing circuit of the plurality of column select multiplexing circuits contained within each input/output group of the plurality of input/output groups and with the column select multiplexing circuit coupled to a write bus true, a write bus complement, a read bus true, and a read bus complement, wherein the column select multiplexing circuit further comprises:

a bitline true connected to a first fuse element;

a bitline complement connected to a second fuse element;

a column select signal;

a first transistor, a second transistor, a third transistor, and a fourth transistor, with each transistor having a gate, a first terminal, and a second terminal, with a first terminal of the first transistor coupled to the read bus true, with a second terminal of the first transistor coupled to the first fuse element and a terminal of the third transistor, with a first terminal of the third transistor coupled to the write bus true, with a first terminal of the second transistor coupled to the second fuse element and a first terminal of the fourth transistor, with a second terminal of the second transistor coupled to the read bus complement, and with a second terminal of the fourth transistor coupled to the write bus complement; and a first inverter and a second inverter, with an input terminal of the first inverter coupled to the column select signal, with an output signal of the first inverter coupled to the gate of the first transistor, the gate of the second transistor, and an input terminal of the second inverter, with an output signal of the second inverter coupled to the gate of the third transistor and the gate of the fourth transistor;

a plurality of redundant column input/output select circuits, with a redundant column input/output select circuit of the plurality of redundant column input/output select circuits contained within each input/output group of the plurality of input/output groups and with the redundant column input/output select circuit coupled to the write bus true, the write bus complement, the read bus true, and the read bus complement, wherein the redundant column input/output select circuit further comprises:

a third fuse element having an first terminal and a second terminal;

a third inverter and a fourth inverter, with each inverter having a first terminal and a second terminal;

a fifth transistor, a sixth transistor, a seventh transistor, an eighth transistor, a ninth transistor, and a tenth transistor, with each transistor having a gate, a first terminal and a second terminal; with a second terminal of the fifth transistor and a second terminal of the sixth transistor coupled to a voltage supply, with a first terminal of the fifth transistor coupled to a first terminal of the sixth transistor, a second terminal of the third fuse element, and a first terminal of the third inverter, with a gate of the sixth transistor coupled to a second terminal of the third inverter, a first terminal of the fourth inverter, a gate of the seventh transistor, and a gate of the eighth transistor, with a second terminal of the fourth inverter coupled to a gate of the ninth transistor and a gate of the tenth transistor; with a first terminal of the seventh transistor coupled to the read bus true; with a first terminal of the eighth transistor coupled to the read bus complement; with a second terminal of the seventh transistor coupled to a first terminal of the ninth transistor and a redundant bitline true; with a first terminal of the eighth transistor coupled to the read bus complement; with a second terminal of the eighth transistor coupled to a first terminal of the tenth transistor and a redundant bitline complement; with a second terminal of the ninth transistor coupled to the write bus true; and with a second terminal of the tenth transistor coupled to the write bus complement;

a redundant column signal coupled to the first terminal of the third fuse element, wherein the redundant column signal is produced by a redundant column select circuit; and a power-on reset signal coupled to the gate of the fifth transistor.

11. The structure of claim 10, wherein the bad prime column of the column select multiplexing circuit is disabled by removing the first fuse element and the second fuse element, thereby isolating the bitline true and the bitline complement from the write bus true, the write bus complement, the read bus true, and the read bus complement.

12. The structure of claim 10, wherein the redundant column of the memory array is enabled by leaving the third fuse element intact and the redundant bitline true and the redundant bitline complement coupled to the write bus true, the write bus complement, the read bus true, and the read bus complement.

13. The structure of claim 10, wherein the redundant column select circuit further comprises:

a fourth fuse element having a first terminal and a second terminal, with the first terminal of the fourth fuse element coupled to a first voltage supply;

a fifth fuse element having a first terminal and a second terminal;

a fifth inverter having a first terminal and a second terminal, with the first terminal of the fifth inverter coupled to the second terminal of the fourth fuse element;

a first logic element having a first input terminal, a second input terminal and an output terminal;

a second logic element having a first input terminal, a second input terminal and an output terminal, with the output terminal of the first logic element coupled to the first input terminal of the second logic element;

a eleventh transistor, a twelfth transistor, a thirteenth transistor, and a fourteenth transistor, with each transistor have a gate, a first terminal and a second terminal, with a first terminal of the eleventh transistor and a first terminal of the twelfth transistor coupled to the second terminal of the fourth fuse element; with a gate of the twelfth transistor coupled to a second terminal of the fifth inverter and a second input terminal of the first logic element; with a second terminal of the eleventh transistor, a second terminal of the twelfth transistor, and a second terminal of the fourteenth transistor coupled to a second supply voltage; a gate of the thirteenth transistor coupled to the output terminal of the first logic element; with a first terminal of the thirteenth transistor coupled to the first supply voltage; with a second terminal of the thirteenth transistor coupled to the output terminal of the first logic element; with a first terminal of the thirteenth transistor coupled to the first supply voltage; with a second terminal of the thirteenth transistor coupled to the second terminal of the fifth fuse element and the second input terminal of the second logic element; with a first terminal of the fourteenth transistor coupled to the first terminal of the fifth fuse element;

a power-on reset signal coupled to a gate of the eleventh transistor;

an enable signal coupled to a first input terminal of the first logic element;

a column select signal coupled to a gate of the fourteenth transistor; and a redundant column signal produced by the second logic element and coupled to the output terminal of the second logic element.

14. The structure of claim 10, wherein the integrated circuit memory device has a multiple block memory architecture and the block is a block of a plurality of blocks.

15. A column redundancy structure of an integrated circuit memory device, comprising:

a block of a memory array of the integrated circuit memory device, wherein the block is divided into a plurality of input/output groups with each input/output group of the plurality of input/output groups having a plurality of columns;

a plurality of redundant column input/output select circuits, with a redundant column input/output select circuit of the plurality of redundant column input/output select circuits contained within each input/output group of the plurality of input/output groups and with the redundant column input/output select circuit coupled to a write bus true, a write bus complement, a read bus true, and a read bus complement, wherein the redundant column input/output select circuit further comprises:

a first fuse element having an first terminal and a second terminal;

a first inverter and a second inverter, with each inverter having a first terminal and a second terminal;

a first transistor, a second transistor, a third transistor, a fourth transistor, a fifth transistor, and a sixth transistor, with each transistor having a gate, a first terminal and a second terminal; with a second terminal of the first transistor and a second terminal of the second transistor coupled to a voltage supply, with a first terminal of the first transistor coupled to a first terminal of the second transistor, a second terminal of the first fuse element, and a first terminal of the first inverter, with a gate of the second transistor coupled to a second terminal of the first inverter, a first terminal of the second inverter, a gate of the third transistor, and a gate of the fourth transistor, with a second terminal of the second inverter coupled to a gate of the fifth transistor and a gate of the sixth transistor; with a first terminal of the third transistor coupled to the read bus true; with a first terminal of the fourth transistor coupled to the read bus complement; with a second terminal of the third transistor coupled to a first terminal of the fifth transistor and a redundant bitline true; with a first terminal of the fourth transistor coupled to the read bus complement; with a second terminal of the fourth transistor coupled to a first terminal of the sixth transistor and a redundant bitline complement; with a second terminal of the fifth transistor coupled to the write bus true and a second terminal of the sixth transistor coupled to the write bus complement;

a redundant column signal coupled to the first terminal of the first fuse element; and a power-on reset signal coupled to the gate of the first transistor.

16. The structure of claim 15, wherein the integrated circuit memory device has a multiple block memory architecture and the block is a block of a plurality of blocks.

17. The structure of claim 15, wherein the redundant column of the memory array is enabled by leaving the first fuse element intact and the redundant bitline true and the redundant bitline complement coupled to the write bus true, the write bus complement, the read bus true, and the read bus complement.

18. The structure of claim 15, wherein the redundant column signal is produced by a redundant column select circuit which comprises:

a second fuse element having a first terminal and a second terminal, with the first terminal of the second fuse element coupled to a first voltage supply;

a third fuse element having a first terminal and a second terminal;

a third inverter having a first terminal and a second terminal, with the first terminal of the third inverter coupled to the second terminal of the second fuse element;

a first logic element having a first input terminal, a second input terminal and an output terminal;

a second logic element having a first input terminal, a second input terminal and an output terminal, with the output terminal of the first logic element coupled to the first input terminal of the second logic element;

a seventh transistor, a eighth transistor, a ninth transistor, and a tenth transistor, with each transistor have a gate, a first terminal and a second terminal, with a first terminal of the seventh transistor and a first terminal of the eighth transistor coupled to the second terminal of the second fuse element; with a gate of the eighth transistor coupled to a second terminal of the third inverter and a second input terminal of the first logic element; with a second terminal of the seventh transistor, a second terminal of the eighth transistor, and a second terminal of the tenth transistor coupled to a second supply voltage; a gate of the ninth transistor coupled to the output terminal of the first logic element; with a first terminal of the ninth transistor coupled to the first supply voltage; with a second terminal of the ninth transistor coupled to the second terminal of the third fuse element and the second input terminal of the second logic element; with a first terminal of the tenth transistor coupled to the first terminal of the third fuse element;

a power-on reset signal coupled to a gate of the seventh transistor;

an enable signal coupled to a first input terminal of the first logic element;

a column select signal coupled to a gate of the tenth transistor; and a redundant column signal produced by the second logic element and coupled to the output terminal of the second logic element.

* * * * *